(12) United States Patent
Kishimoto et al.

(10) Patent No.: US 8,619,424 B2
(45) Date of Patent: Dec. 31, 2013

(54) ELECTRONIC DEVICE

(75) Inventors: Kazutaka Kishimoto, Fukuoka (JP); Makoto Kojyo, Fukuoka (JP)

(73) Assignee: Kabushiki Kaisha Yaskawa Denki, Kitakyushu-Shi (JP)

(*) Notice: Subject to any disclaimer, the term of this patent is extended or adjusted under 35 U.S.C. 154(b) by 174 days.

(21) Appl. No.: 13/228,432

(22) Filed: Sep. 8, 2011

(65) Prior Publication Data
US 2012/0063089 A1  Mar. 15, 2012

(30) Foreign Application Priority Data

Sep. 10, 2010  (JP) ................. 2010-203537

(51) Int. Cl.
*H05K 7/20* (2006.01)
(52) U.S. Cl.
USPC ............ 361/697; 361/679.47; 361/679.49; 361/679.51; 361/695; 165/80.3; 165/104.33; 165/121; 165/122; 454/184
(58) Field of Classification Search
USPC .......... 361/679.46–679.54, 690–697, 688, 361/689, 715, 719–724, 622, 624, 631; 165/80.2, 80.3, 104.32, 104.33, 165/121–126, 185; 312/223.1, 223.2, 312/223.3, 236; 363/15, 26, 39, 63–75, 363/141–143, 243–246, 251, 255, 292; 307/44, 75, 77, 112, 143–148; 454/184
See application file for complete search history.

(56) References Cited

U.S. PATENT DOCUMENTS

| | | | | |
|---|---|---|---|---|
| 4,520,425 A | * | 5/1985 | Ito ................... | 361/697 |
| 4,901,138 A | * | 2/1990 | Kushibiki et al. ........ | 257/721 |
| 5,170,336 A | * | 12/1992 | Getter et al. ............ | 363/141 |
| 6,046,921 A | * | 4/2000 | Tracewell et al. ........ | 363/141 |
| 6,477,965 B2 | * | 11/2002 | Yamaguchi et al. ....... | 105/59 |
| 6,493,227 B2 | * | 12/2002 | Nielsen et al. ........... | 361/703 |
| 6,862,182 B1 | * | 3/2005 | Roman et al. ............ | 361/697 |
| 6,930,883 B2 | * | 8/2005 | Hsieh et al. ............. | 361/695 |

(Continued)

FOREIGN PATENT DOCUMENTS

| | | |
|---|---|---|
| JP | 08-308036 | 11/1996 |
| JP | 2000-232792 | 8/2000 |
| JP | 2002-010524 | 1/2002 |

(Continued)

OTHER PUBLICATIONS

Extended European Search Report for corresponding EP Application No. 11180130.4-2214, Jan. 7, 2013.
Japanese Office Action for corresponding JP Application No. 2010-203537, Jul. 18, 2012.

*Primary Examiner* — Michail V Datskovskiy
(74) *Attorney, Agent, or Firm* — Ditthavong Mori & Steiner, P.C.

(57) ABSTRACT

An electronic device includes a main body having an air inlet port and an air outlet port, an air channel having an air inlet port and an air outlet port and is arranged such that the air channel and the main body oppose each other, a boundary base disposed between the main body and the air channel, a heat sink mounted on the boundary base such that a fin thereof protrudes into the air channel, a power converter tightly mounted on an upper surface of a base of the heat sink so as to be positioned in the main body, cooling fans disposed near the air outlet port of the main body and the air outlet port of the air channel, and a first reactor disposed on a windward side of the heat sink in the air channel.

9 Claims, 4 Drawing Sheets

(56) References Cited

U.S. PATENT DOCUMENTS

| | | | |
|---|---|---|---|
| 7,616,442 B1 * | 11/2009 | Kaveh | 361/697 |
| 8,379,384 B2 * | 2/2013 | Smalen et al. | 361/679.51 |
| 2006/0120045 A1 | 6/2006 | Van Der Werff | |
| 2010/0079944 A1 * | 4/2010 | Loth | 361/695 |
| 2010/0296246 A1 * | 11/2010 | Kishimoto et al. | 361/695 |
| 2010/0302728 A1 * | 12/2010 | Knaup et al. | 361/690 |

FOREIGN PATENT DOCUMENTS

| | | |
|---|---|---|
| JP | 2004-088023 | 3/2004 |
| JP | 2005-348534 | 12/2005 |
| JP | 2005-536869 | 12/2005 |

* cited by examiner

ELECTRONIC DEVICE

CROSS-REFERENCE TO RELATED APPLICATION

The present application claims priority under 35 U.S.C. §119 to Japanese Patent application No. 2010-203537, filed Sep. 10, 2010. The contents of this application are incorporated herein by reference in their entirety.

BACKGROUND OF THE INVENTION

1. Field of the Invention

The embodiments disclosed herein relate to electronic devices.

2. Discussion of the Background

There is a demand to reduce the size of electronic devices such as, for example, inverters, converters, and servo amplifiers in order to save space. As one such measure, cooling efficiency is improved, thereby reducing the sizes of power converters, reactors, and so forth assembled in these electronic devices.

For this reason, the related-art electronic devices have a structure, for example, as described in Japanese Unexamined Patent Application Publication No. 2002-10524 disclosed on Jan. 11, 2002.

According to the above-described document, an air guide is provided between two groups of power converters. The power converters are cooled by two cooling fans, and the cooling air flows having flowed through the power converters are supplied to reactors and exhausted as separate flows.

SUMMARY OF THE INVENTION

According to an aspect of the present invention, an electronic device includes a main body that has an air inlet port and an air outlet port, an air channel that has an air inlet port and an air outlet port and is arranged such that the air channel and the main body oppose each other, a boundary base that is disposed between the main body and the air channel, a heat sink that is mounted on the boundary base such that a fin thereof protrudes into the air channel, a power converter that is tightly mounted on an upper surface of a base of the heat sink so as to be positioned in the main body, cooling fans that are respectively disposed near an air outlet port of the main body and an air outlet port of the air channel, and a first reactor that is disposed on a windward side of the heat sink in the air channel.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
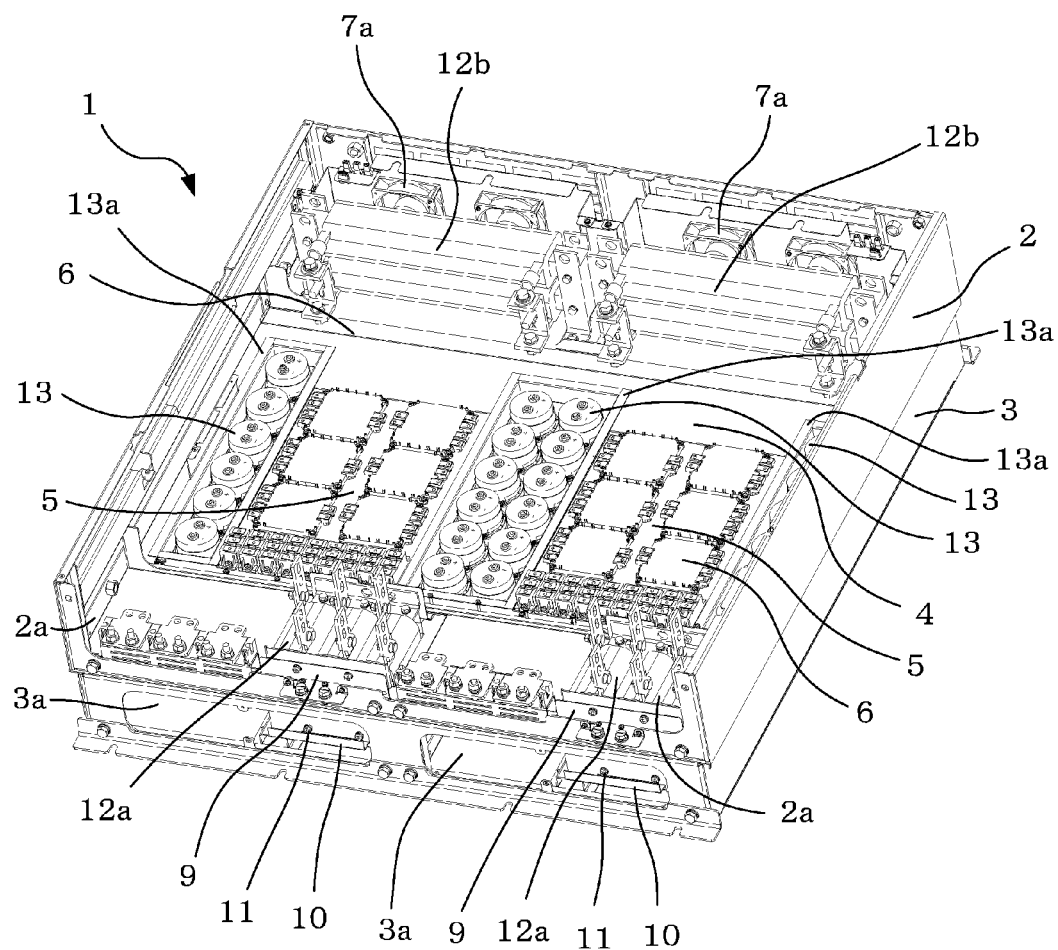
FIG. 1 is a perspective view of an inverter of a first embodiment according to the present invention.

Embodiments according to the present invention will now be described with reference to the accompanying drawings, wherein like reference numerals designate corresponding or identical elements throughout the various drawings, thereby omitting duplicated descriptions where appropriate.

Although the embodiments according to the present invention will be described with an inverter as an example of an electronic device, it is clear that the present invention can be similarly embodied in other electronic devices such as converters and servo amplifiers.

First Embodiment

Figure 2:
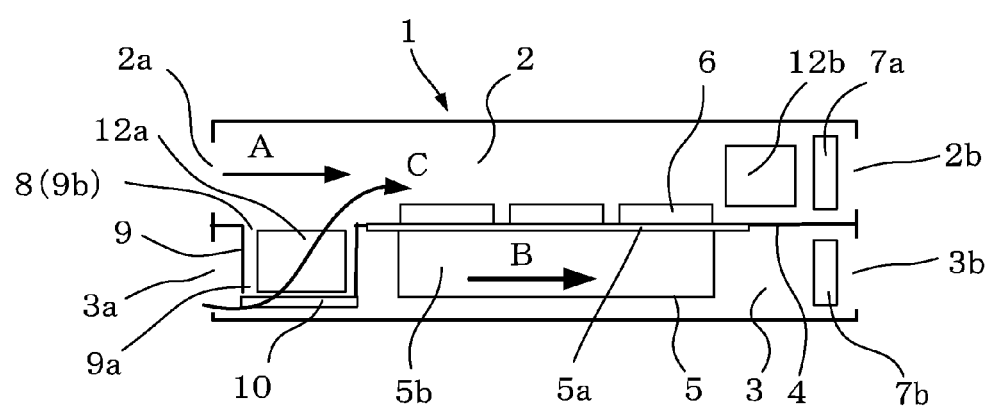
FIG. 2 is an outline side sectional view of the inverter illustrated in FIG. 1.
Figure 3:
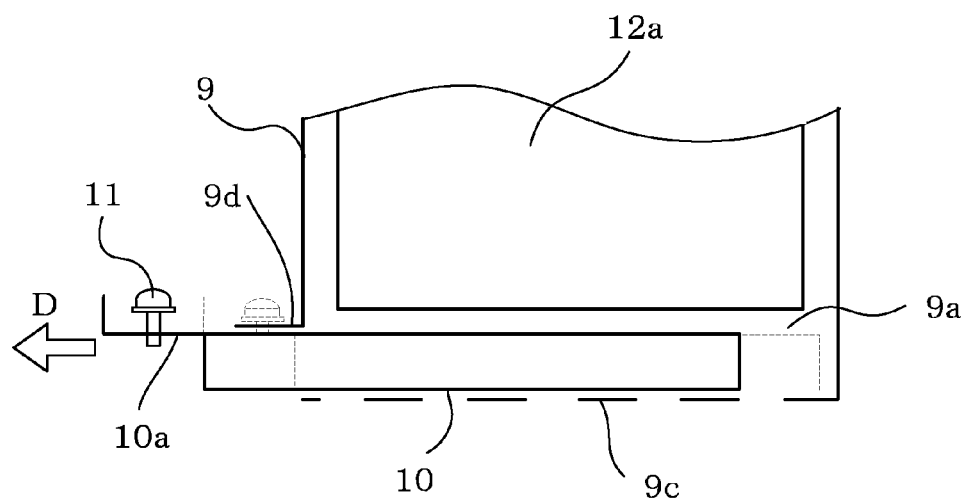
FIG. 3 is an enlarged view of a duct illustrated in FIG. 2.

Referring to FIGS. 1 to 3, the structure of an inverter of a first embodiment according to the present invention will be described. FIG. 1 is a perspective view of the inverter of the first embodiment according to the present invention. FIG. 2 is an outline side sectional view of the inverter illustrated in FIG. 1. FIG. 3 is an enlarged view of a duct illustrated in FIG. 2.

An inverter 1 of the present embodiment will be arranged in a housing of a control board or the like (not shown) for use. As illustrated in FIGS. 1 and 2, the inverter 1 includes a main body 2 and an air channel 3, which oppose each other so as to form a double-layer structure. In FIG. 1, with respect to the orientation of the inverter 1, the upper side in the figure corresponds to the upper side of the inverter 1, and the lower side in the figure corresponds to the lower side of the inverter 1. The front side in the figure corresponds to the front side of the inverter 1, and the rear side in the figure corresponds to the rear side of the inverter 1. FIG. 1 illustrates the inverter 1 with a front plate removed so as to easily see the internal structure of the inverter 1.

As illustrated in FIGS. 1 and 2, the main body 2 has air inlet ports 2a on the lower side thereof and air outlet ports 2b on the upper side thereof. As is the case with the main body 2, the air channel 3 has air inlet ports 3a on the lower side and air outlet ports 3b on the upper side.

In some cases, the air channel 3 is disposed inside the control board. In other cases, the air channel 3 is disposed outside the control board in order to increase cooling effects by exposing heat sinks to outside air having a lower temperature. The first embodiment represents a case in which the air channel 3 is disposed outside the control board.

The inverter 1 includes a boundary base 4 at a boundary between the main body 2 and the air channel 3. The inverter 1 is mounted by securing the boundary base 4 to a rear surface of the housing of the control board.

Heat sinks 5 are mounted in the boundary base 4. Bases 5a of the heat sinks 5 are mounted on the boundary base 4 and fins 5b of the heat sinks 5 protrude into the air channel 3, which is an area outside the control board. In FIG. 1, two heat sinks 5 are spaced apart from each other.

Power converters 6 are tightly secured to upper surfaces of the bases 5a of the heat sinks 5.

Cooling fans 7a and 7b are respectively disposed on the upper side of the main body 2 of the inverter 1 and the upper side of the air channel 3 of the inverter 1.

The boundary base 4 has communicating holes 8 on the windward side of the heat sinks 5. The communicating holes 8 connect the main body 2 to the air channel 3. Ducts 9 that correspond to the communicating holes 8 are mounted in the boundary base 4. One of the ends of each duct 9 is open at the communicating hole 8, and defines an air outlet port 9b. Another open end of the duct 9, that is, an opening on the side opposite the communicating hole 8 defines an air inlet port 9a.

The duct 9 is provided with an air filter 10 over the air inlet port 9a used in introducing outside air flowing in the air channel 3 through the air inlet port 9a. The air filter 10 is removably mounted in the duct 9 using a sliding method. For example, as illustrated in FIG. 3, a ventilating portion 9c is provided for the air inlet port 9a of the duct 9 while a gap that allows the air filter 10 to slide is kept, thereby supporting the air filter 10 with the ventilating portion 9c such that the air filter 10 is slidable in the arrow D direction. The air filter 10 is secured with fixing screws 11 that are inserted through U-shaped cutouts formed in a flange 9d at the air inlet port 9a of the duct 9 and are fastened to a handle 10a of the air filter 10. The air filter 10 can be easily removed by loosening the fixing screws 11 and sliding the air filter 10 without completely removing the fixing screws 11. The air filter 10 can also be easily mounted in an opposite situation. In FIG. 3, the position represented by the dotted line is a position at which the air filter 10 is secured, and the position represented by the solid line is an intermediate position at which the fixing screws 11 are loosened and the air filter 10 is slid.

First reactors 12a (for example, AC reactors) are disposed in the ducts 9. The first reactors 12a are mounted on the boundary base 4, or may be mounted in the ducts 9 when the ducts 9 have sufficient strength.

In the main body 2, second reactors 12b (for example, DC reactors) are disposed on the leeward side of the power converters 6, that is, between the power converters 6 and the cooling fans 7a. The second reactors 12b are mounted on the boundary base 4.

As illustrated in FIG. 1, a plurality of capacitors 13 are linearly arranged on each side of each of the two heat sinks 5 on the boundary base 4. The capacitors 13 are housed in capacitor casings 13a and disposed so as to protrude into the air channel 3. The length of each capacitor casing 13a that houses the capacitors 13 is greater than the length of the heat sink 5 so as to allow the capacitor casing 13a to perform a function of a guide for a cooling air flow in the air channel 3.

With the above-described structure, cooling of the inverter 1 is performed as follows.

When the inverter 1 is driven, components such as the first reactors 12a, the second reactors 12b, the power converters 6, and the capacitors 13 heat up. These components are cooled by cooling air flows caused by the cooling fans 7a and 7b.

In the main body 2, a cooling air flow having caused by the cooling fans 7a and entered the main body 2 through the air inlet ports 2a flows toward the air outlet ports 2b as indicated by the arrow A. In so doing, the cooling air flow cools the power converters 6 and the second reactors 12b disposed in the main body 2.

In the air channel 3, a cooling air flow having caused by the cooling fans 7b and entered the air channel 3 through the air inlet ports 3a flows toward the air outlet ports 3b as indicated by the arrow B. In so doing, the cooling air flow cools the heat sinks 5 and the capacitors 13.

By cooling the heat sinks 5, the power converters 6 that are tightly secured to the upper surfaces of the bases 5a of the heat sinks 5 and that transfer most of the heat generated thereby to the heat sinks 5 are cooled. Thus, the temperature of the cooling air flow flowing in the main body 2 does not significantly increase in heat exchange with the power converters 6.

In the air channel 3, the ducts 9 that connect the air channel 3 to the main body 2 are provided, and the first reactors 12a are disposed in the ducts 9.

As indicated by the arrow C, part of the cooling air flow flowing in the air channel 3 passes through the air filters 10, enters the ducts 9 through the air inlet ports 9a of the ducts 9, cools the first reactors 12a, and enters the main body 2. The cooling air flow having entered the main body 2 joins the cooling air flow indicated by the arrow A flowing in the main body 2, thereby contributing to cooling of the power converters 6 and the second reactors 12b.

In this case, the first reactors 12a are positioned on the windward side of the respective heat sinks 5. Thus, the first reactors 12a are not adversely affected by the heat generated by the power converters 6, and desirably cooled by the cooling air flow flowing in the air channel 3.

The cooling air flow having cooled the first reactors 12a does not contact the fins 5b of the heat sinks 5. Thus, the cooling air flow heated by the first reactors 12a does not adversely affects cooling of the heat sinks 5. The cooling air flow heated by the first reactors 12a is just part of the cooling air flow flowing in the main body 2, and accordingly, does not significantly adversely affect cooling of the power converters 6 and the second reactors 12b.

In addition, the air filters 10 are provided over the air inlet ports 9a of the ducts 9. Thus, for example, even when a controller or the like that houses the inverter 1 is installed at a location in an undesirable environment, the chances of the inverter 1 being affected by dust and the like can be reduced, and accordingly, defects in the inverter 1 can be suppressed. The air filters 10 are each mounted over the air inlet port 9a of the duct 9, which is smaller than the air inlet port 3a of the air channel 3. Thus, the size of the air filter 10 can be reduced.

Second Embodiment

The above-described first embodiment represents a case in which the air channel 3 is disposed outside the control board.

The present embodiment represents a case in which the air channel 3 is disposed inside the control board.

Figure 4:
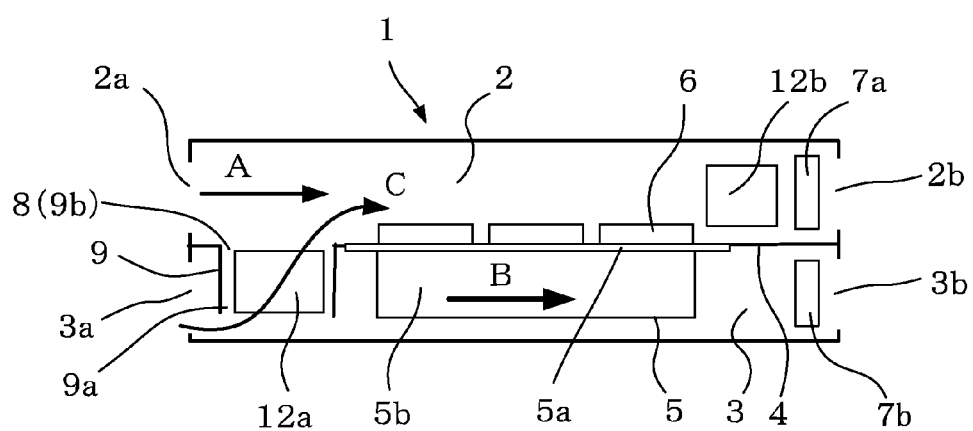
FIG. 4 is an outline side sectional view of an inverter of a second embodiment according to the present invention.

When the air channel 3 is also disposed inside the control board, the air filters 10 are unnecessary. Thus, as illustrated in FIGS. 3 and 4, the fixing screws 11 are loosened, and the air filters 10 are slid and removed from the air inlet ports 9a of the respective ducts 9.

In this case, although outside air having a low temperature is not introduced, air capacity for cooling can be increased due to decreased resistance when air is introduced through the ducts 9.

Third Embodiment

Figure 5:
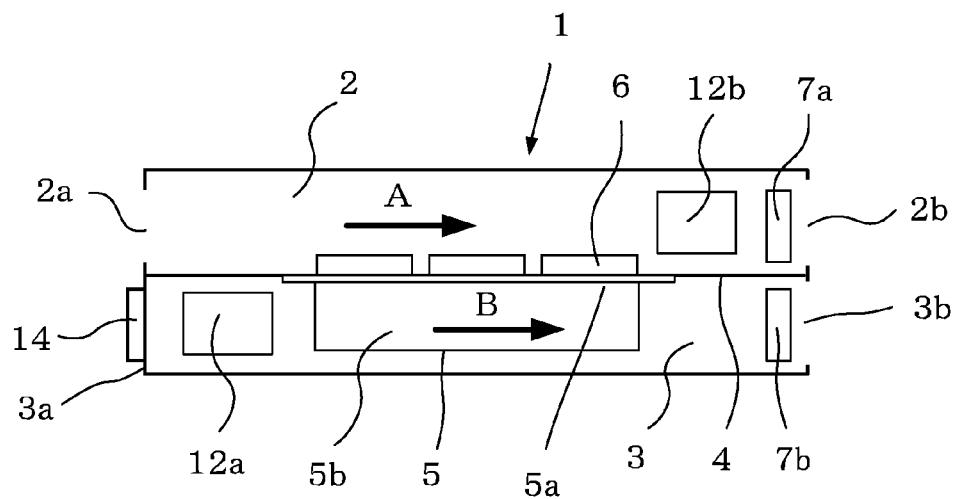
FIG. 5 is an outline side sectional view of an inverter of a third embodiment according to the present invention.

The first and second embodiments represent structures in which the ducts 9 are provided in the air channel 3. However, as illustrated in FIG. 5, the ducts may not be provided. FIG. 5 illustrates a case in which the air channel 3 is disposed outside the control board.

In this case, cooling air flow indicated by the arrow B having passed through the air filters 14 and entered the air channel 3 from the air inlet ports 3a of the air channel 3 directly contacts the first reactors 12a in a desirable flow without striking the ducts. Thus, compared to the first embodiment, the first reactors 12a are desirably cooled. On the other hand, part of the cooling air flow flowing in the air channel 3 is heated by the first reactors 12a. However, a cooling air flow that does not contact the first reactors 12a also flows toward the heat sinks 5. Thus, this structure does not significantly adversely affect the cooling of the heat sinks 5.

Fourth Embodiment

The above-described third embodiment represents a case in which the air channel 3 is disposed outside the control board.

The present embodiment represents a case in which the air channel 3 is disposed inside the control board.

Figure 6:
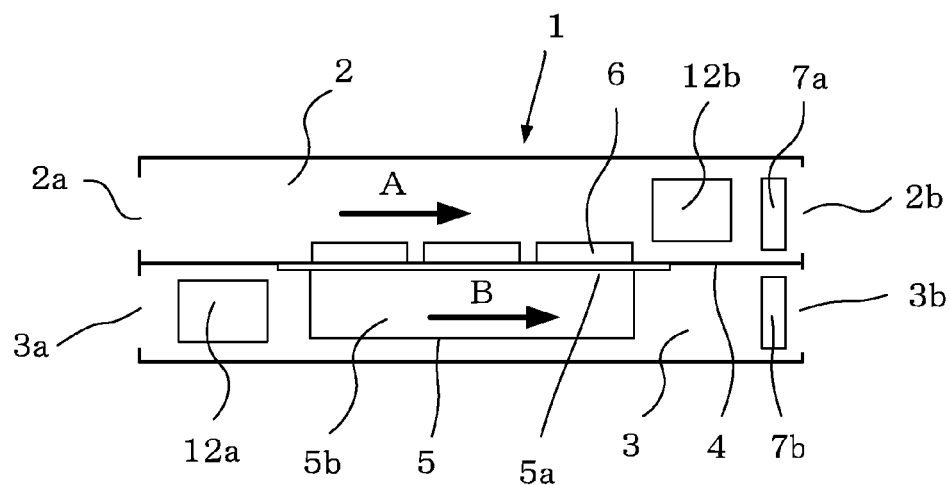
FIG. 6 is an outline side sectional view of an inverter of a fourth embodiment according to the present invention.

When the air channel 3 is also disposed inside the control board, the air filters 10 are unnecessary. Thus, as illustrated in FIG. 6, the air filters 10 are removed from the air inlet ports 3a of the air channel 3.

In this case, although outside air having a low temperature is not introduced, air capacity for cooling can be increased due to decreased resistance when air is introduced through the air inlet ports 3a.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An electronic device comprising:
   a main body that has an air inlet port and an air outlet port;
   an air channel that has an air inlet port and an air outlet port, the air channel being arranged such that the air channel and the main body oppose each other;
   a boundary base that is disposed between the main body and the air channel;
   a heat sink that is mounted on the boundary base such that a fin thereof protrudes into the air channel;
   a power converter that is tightly mounted on an upper surface of a base of the heat sink so as to be positioned in the main body;
   cooling fans that are disposed near the air outlet port of the main body and the air outlet port of the air channel;
   a first reactor that is disposed on a windward side of the heat sink in the air channel; and
   a second reactor that is disposed on a leeward side of the power converter in the main body.

2. An electronic device comprising:
   a main body that has an air inlet port and an air outlet port;
   an air channel that has an air inlet port and an air outlet port, the air channel being arranged such that the air channel and the main body oppose each other;
   a boundary base that is disposed between the main body and the air channel;
   a heat sink that is mounted on the boundary base such that a fin thereof protrudes into the air channel;
   a power converter that is tightly mounted on an upper surface of a base of the heat sink so as to be positioned in the main body;
   cooling fans that are disposed near the air outlet port of the main body and the air outlet port of the air channel; and
   a first reactor that is disposed on a windward side of the heat sink in the air channel,
   wherein a communicating hole that connects the main body to the air channel is formed on the windward side of the heat sink in the boundary base.

3. The electronic device according to claim 2, further comprising:
   a duct that is mounted on the boundary base, the duct corresponding to the communicating hole,
   wherein the first reactor is disposed in the duct.

4. The electronic device according to claim 3,
   wherein the duct is disposed in the air channel, and an air outlet port of the duct defines the communicating hole.

5. The electronic device according to claim 1, further comprising:
   an air filter provided over the air inlet port of the air channel.

6. The electronic device according to claim 4, further comprising:
   an air filter provided over an air inlet port of the duct.

7. The electronic device according to claim 6,
   wherein the air filter is removably provided over the air inlet port of the duct.

8. The electronic device according to claim 7,
   wherein the air filter is provided over the air inlet port of the duct such that the air filter is slidable relative to the air inlet port of the duct.

9. The electronic device according to claim 8,
   wherein a ventilating portion is provided at the air inlet port of the duct, the ventilating portion supporting the air filter such that the air filter is slidable relative to the ventilating portion.

\* \* \* \* \*